United States Patent
Hanaoka

(10) Patent No.: US 7,459,637 B2
(45) Date of Patent: Dec. 2, 2008

(54) SEMICONDUCTOR DEVICE, MANUFACTURING METHOD THEREOF, CIRCUIT BOARD, AND ELECTRONIC APPLIANCE

(75) Inventor: Terunao Hanaoka, Suwa (JP)

(73) Assignee: Seiko Epson Corporation (JP)

( * ) Notice: Subject to any disclaimer, the term of this patent is extended or adjusted under 35 U.S.C. 154(b) by 243 days.

(21) Appl. No.: 11/079,399

(22) Filed: Mar. 14, 2005

(65) Prior Publication Data
US 2005/0199997 A1    Sep. 15, 2005

(30) Foreign Application Priority Data
Mar. 15, 2004    (JP)    ............. 2004-073013

(51) Int. Cl.
*H05K 1/03*    (2006.01)
(52) U.S. Cl. .................... 174/255; 174/261
(58) Field of Classification Search ............... 174/255, 174/260, 261, 262
See application file for complete search history.

(56) References Cited

U.S. PATENT DOCUMENTS 6,707,153 B2    3/2004    Kuwabara et al.

2002/0008320 A1 *    1/2002    Kuwabara et al. ........... 257/738

FOREIGN PATENT DOCUMENTS

| JP | 2003-282790 | 10/2003 |
|---|---|---|
| JP | 2004-134708 | 4/2004 |
| WO | WO 00/55898 | 9/2000 |
| WO | WO 01/71805 | 9/2001 |

* cited by examiner

*Primary Examiner*—Dean A. Reichard
*Assistant Examiner*—Yuriy Semenenko
(74) *Attorney, Agent, or Firm*—Harness, Dickey & Pierce, P.L.C.

(57) ABSTRACT

The semiconductor device includes the following: a semiconductor chip, in which an integrated circuit is formed, having a polygon surface, and a plurality of electrodes thereon, that is electrically connected to the integrated circuit, is installed on the polygon surface; a first resin layer formed over the polygon surface of the semiconductor chip; a wiring that includes a first part and a second part that are located on the first resin layer; an external terminal installed on the first part of the wiring; and a second resin layer formed over each of the first resin layers so as to cover the second part of the wiring. The plurality of electrodes is disposed along remaining second sides, excluding at least one of the first sides of the polygon surface, and the second resin layer is formed to avoid the area between a side edge located on the side of the first side of the first resin layer and the first side.

7 Claims, 4 Drawing Sheets

SEMICONDUCTOR DEVICE, MANUFACTURING METHOD THEREOF, CIRCUIT BOARD, AND ELECTRONIC APPLIANCE

RELATED APPLICATIONS

This application claims priority to Japanese Patent Application No. 2004-073013, filed Mar. 15, 2004 which is hereby expressly incorporated by reference herein in its entirety.

BACKGROUND

1. Technical Field

The present invention relates to a semiconductor device and its manufacturing method, and to a circuit board and an electronic appliance.

2. Related Art

A structure for a semiconductor device that absorbs the external force added to an external terminal (for example, a solder ball) with a resin layer formed on a semiconductor chip is being developed. In this structure, it is common to form a solder resist layer over the resin layer. Also, since a liquid material was used for forming the solder resist layer, it thickens near the rim of the resin layer, by a surface tension. Therefore, an internal stress tended to concentrate on the edge of the solder resist layer and the rim of the resin layer.

The present invention aims to suppress an effect caused by the concentration of an internal stress.

SUMMARY

A semiconductor device in the present invention includes the following:
- a semiconductor wafer formed with a plurality of integrated circuits;
- a plurality of first resin layers arranged on the semiconductor wafer at a distance from each other;
- a plurality of electrodes installed adjacent to each of the first resin layers, and electrically coupled to at least either one of the integrated circuits of the semiconductor wafer;
- a wiring that includes a first part and a second part located on each of the first resin layers;
- an external terminal installed on the first part of the wiring; and
- a second resin layer formed over each of the first resin layer so as to cover the second part of the wiring;
- wherein the plurality of the first resin layer is arranged, so that a first distance between an adjacent pair of the first resin layers in the first direction, is smaller than a second distance between an adjacent pair of the first resin layers in a second direction that is different from the first direction; and
- the second resin layer is formed to avoid the area between the adjacent pair of the first resin layers in the first direction. In the present invention, the second resin layer is installed in a way to avoid the area, which is the narrower distance between the first resin layers that are adjacent to each other (the first distance). On this area, the second resin layer tends to get thick. Furthermore, in the second resin layer, its edge, where its internal stress tends to concentrate, avoids the area of the first distance. Therefore, it is possible to suppress the effect on the semiconductor wafer caused by the internal stress concentration of the second resin layer.

In this semiconductor device, the second resin layer maybe formed so as to exceed the first resin layer in the second direction, and has a curved part so that the location of a side edge deviates in the first direction.

The semiconductor device in the present invention includes the following: a semiconductor chip, in which an integrated circuit is formed, having a polygon surface, and a plurality of electrodes thereon, that is electrically coupled to the integrated circuit, is installed on the polygon surface;
- a first resin layer formed over the polygon surface of the semiconductor chip;
- a wiring that includes a first part and a second part that are located on the first resin layer;
- an external terminal installed on the first part of the wiring; and
- a second resin layer formed over each of the first resin layers so as to cover the second part of the wiring;
- wherein the plurality of electrodes is disposed along remaining second sides, excluding at least one of the first sides of the polygon surface; and
- the second resin layer is formed to avoid the area between a side edge located on the side of the first side of the first resin layer and the first side. In the present invention, the second resin layer is installed so as to avoid the area where the electrodes are not disposed. Moreover, in the second resin layer, its edge, where its internal stress tends to concentrate, avoids the area where the electrodes are not disposed. Hence, it is possible to suppress the effect on the semiconductor chip caused by the internal stress concentration of the second resin layer.

In this semiconductor device, the side edge, located on the side of the first side of the second resin layer, has a curved part that is diversely distant from the first side.

A circuit board in the present invention is provided with the semiconductor device mounted on it.

An electronic appliance in the present invention has the above-mentioned semiconductor device.

A manufacturing method of the semiconductor device in the present invention may include the following steps of:
- forming a plurality of first resin layers at a distance from each other, on a semiconductor wafer, whereon a plurality of integrated circuits is formed, and includes a plurality of group of electrodes that are electrically coupled to at least either one of the integrated circuits;
- forming a wiring so as to include a first part and a second part located on each of the first resin layers;
- forming a second resin layer over each of the first resin layers so as to cover the second part of the wiring; and
- installing an external terminal on the first part of the wiring;
- wherein each of the first resin layers is formed so that one group of the electrodes is arranged next to the first resin layer;
- the plurality of the first resin layer is formed, so that a first distance between an adjacent pair of the first resin layers in the first direction, is smaller than a second distance between an adjacent pair of the first resin layers in a second direction that is different from the first direction; and
- the second resin layer is formed to avoid the area between the adjacent pair of the first resin layers in the first direction. In the present invention, the second resin layer is installed in a way to avoid the area, which is the narrower distance between the first resin layers that are adjacent to each other (the first distance). On this area, the second resin layer tends to get thick. Furthermore, the second resin layer is formed in a way that its edge, where its internal stress tends to concentrate, avoids the area of the first distance. Therefore, it is possible to suppress the effect on the semiconductor wafer caused by the internal stress concentration of the second resin layer.

DETAILED DESCRIPTION

The embodiment of the present invention will now be described with reference to drawings.

Figure 1:
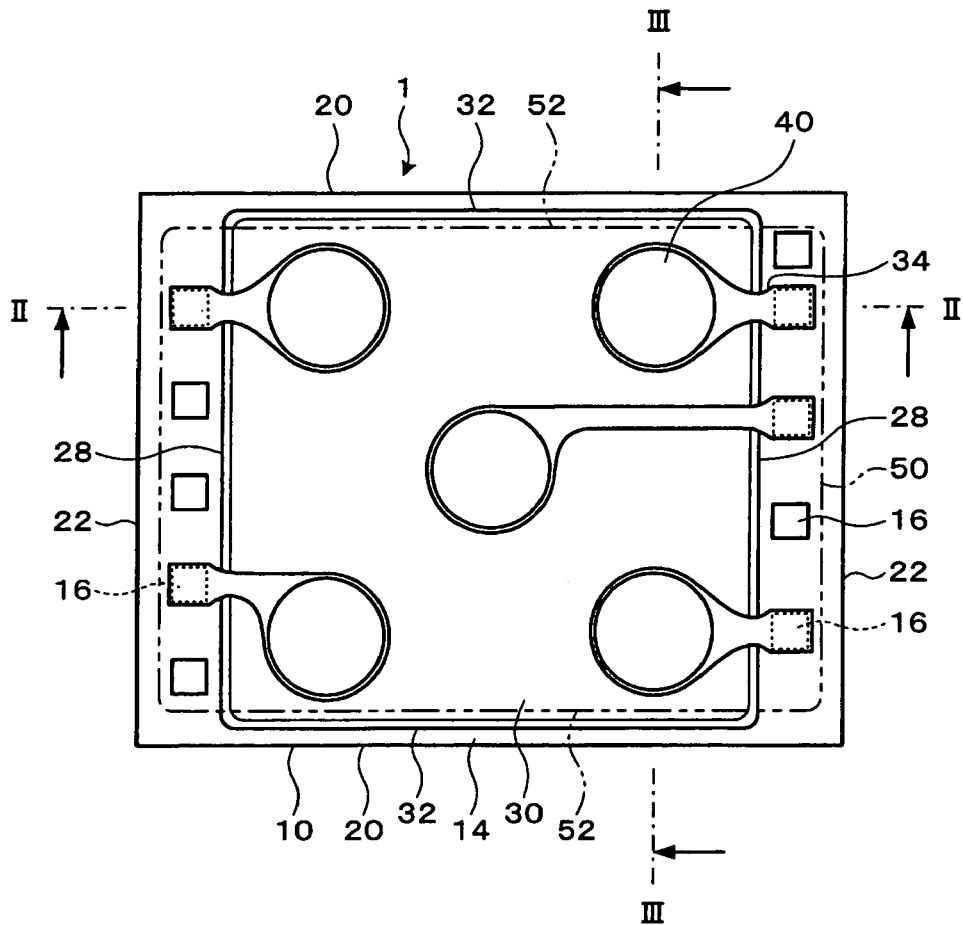
FIG. 1 is a drawing that shows the semiconductor device in the present embodiment.
Figure 2:
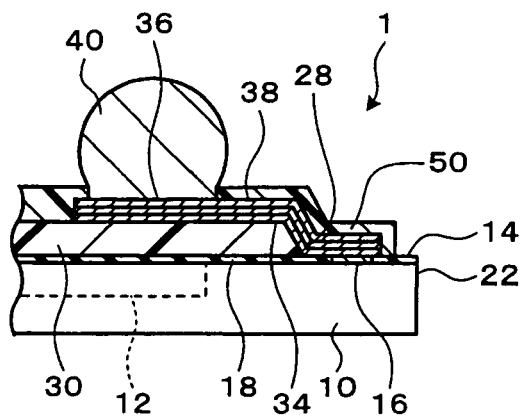
FIG. 2 is a drawing that shows the part of section II-II of the semiconductor device shown in FIG. 1.
Figure 3:
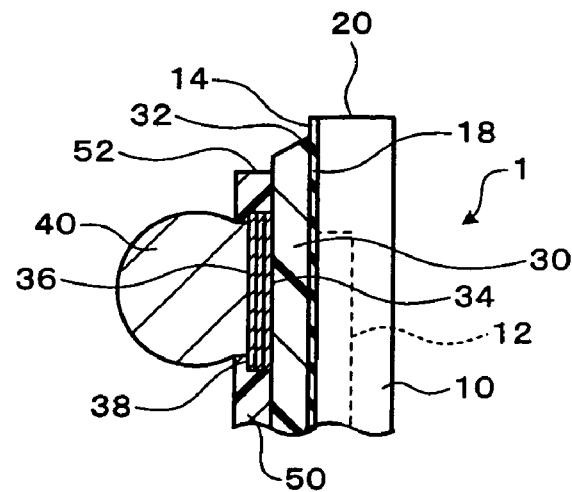
FIG. 3 is a drawing that shows the part of section III-III of the semiconductor device shown in FIG. 1.

FIG. 1 shows the semiconductor device in the present embodiment. FIG. 2 shows the part of section II-II of the semiconductor device shown in FIG. 1. FIG. 3 shows the part of section III-III of the semiconductor device shown in FIG. 1.

A semiconductor device 1 has a semiconductor chip 10. An integrated circuit 12 is formed in the semiconductor chip 10. The integrated circuit 12 includes an active element such as transistor, etc. The semiconductor chip 10 has a polygon surface 14 (for example, a quadrangular surface) as shown in FIG. 1. The polygon surface 14 may have a shape of polygon (for example, rectangular) with its angles chipped.

A plurality of electrodes (for example, pads) is installed in the polygon surface 14. An electrode 16 is electrically coupled to the interior of the semiconductor chip 10 (for example, the integrated circuit 12 or a semiconductor crystal part avoiding the integrated circuit 12). The plurality of electrodes 16 is disposed at the edge of the polygon surface 14. The plurality of electrodes 16 is disposed along the remaining second sides 22, excluding at least one of first sides 20 of the polygon surface 14. In the example shown in FIG. 1, the polygon surface 14 is rectangular, and the plurality of electrodes 16 is disposed along the pair of the sides 22 that are parallel (opposite) to each other, excluding one pair of the first sides 20 that are parallel (opposite) to each other.

As shown in FIG. 2 and FIG. 3, a passivation film 18 (for example, a silicon nitride film or a silicon oxide film) is formed on the polygon surface 14 of the semiconductor chip 10. The passivation film 18 is formed avoiding at least the center part of the electrode 16 (so as to expose the center part).

On the polygon surface 14 (for example, on the passivation film 18), a first resin layer 30, composed of at least one layer, is formed as shown in FIG. 2 and FIG. 3. The first resin layer 30 may be formed in the center part of the polygon surface 14. The first resin layer 30 is formed avoiding the electrode 16, and the distance between a side edge 28 on the side of the electrode 16 and the second side 22 is longer than the distance between a side edge 32, which is on the side of the first side 20, and the first side 20. The side surface of the first resin layer 30 may incline so that either one of the upper surface or the base (for example, the base) is larger than the other (for example, the upper surface). Here, the sides of the larger surface (for example, the base) are the side edges 28 and 32 of the first resin layer 30. The first resin layer 30 may have a stress relief function. It is possible to form the first resin layer 30 with resin such as polyimide resin, degenerate silicon polyimide resin, epoxy resin, degenerate silicon epoxy resin, benzocyclobutene (BCB), polybenzoxazole (PBO), etc.

The semiconductor device 1 includes a plurality of wiring 34. The wiring 34 includes the first part 36, and the second part 38 as shown in FIG. 2. The first part 36 may be a land, and the second part 38 may be a line. The first part 36 and the second part 38 are located on the first resin layer 30. The wiring 34 is formed with conductive material (for example, metals). The wiring 34 is formed in a single or a plurality of layers. When formed with a plurality of layers, the wiring 34 can be formed combining different multiple materials (for example, copper (Cu), chrome (Cr), titanium (Ti), nickel (Ni), titanium tungsten (TiW), gold (Au), aluminum (Al), nickel vanadium (NiV), or tungsten (W)), considering the reliability of the structure and its electric characteristics. The wiring 34 is formed so as to have an overlap with the electrode 16, and is electrically coupled to the electrode 16. The wiring 34 extends from the electrode 16 to over the first resin layer 30. The wiring 34 is formed to go through a side surface (an incline) of the first resin layer 30 and to reach its top surface.

The semiconductor device 1 includes a plurality of external terminals 40. The external terminal 40 is installed on the first part 36 of the wiring 34, and is electrically connected to the electrode 16 as well as to the wiring 34. The external terminal 40 may be formed with metals having conductivity, or with wax. It may have a shape of, for example, a cut-off sphere, and may be a solder ball.

On the first resin layer 30, a second resin layer 50 is formed. The second resin layer 50 may either be opaque or optically transparent. It is formed to cover the second part 38 of the wiring 34, and to avoid (to expose) the first part 36 of the wiring 34. Solder resist may be used for the second resin layer 50. The second resin layer 50 may be formed to cover at least a part of the wiring 34 (for example, the entire part except for the first part 36, or at least the second part 38). By forming the second resin layer 50, it is possible to prevent oxidation, corrosion, or breaking of wire of the wiring 34.

The second resin layer 50 is formed to avoid the area between the side edge 32 of the first resin layer and the first side 20, at the side of the first side 20 in the polygon surface 14. More specifically, it is formed so as not to reach over the semiconductor chip 10 at the side of the first side 20. Furthermore, a side edge 52 of the second resin layer 50 is located in the inner side (toward the center of the polygon surface 14) of the side edge 32 of the first resin layer 30, and the part including the side edge 32 of the first resin layer 30 is not covered by the second resin layer 50. Since this exposed part does not have the second resin layer 30 above, an internal stress has less effect on the semiconductor chip 10 (more specifically, the passivation film 18). At the same time, in the first resin layer 30 and in the second resin layer 50, their side edges 32 and 52, where internal stresses tend to concentrate, are arranged in deviation. It is therefore possible to disperse internal stress.

Here, in the side of the second side 22 of the polygon surface 14, the second resin layer 50 is formed to reach the area between the side edge 28 of the first resin layer 30 and the second side 22. That is to say, the second resin layer 50 is formed to reach over the semiconductor chip 10 (and the electrode 16) in the side of the second side 22.

Aside from the example shown in FIG. 2 and FIG. 3, a third resin layer may further be formed over the second resin layer 50. The third resin layer may also be formed around the external terminal 40. It may be installed to expose the tip end part (upper part) of the external terminal 40, in which case it may cover the root part (lower part) of the external terminal 40. This enables to reinforce the root part of the external terminal 40. If the third resin layer is formed with a material that has either a smaller modulus or a lower level of hardening and contraction than that of the second resin layer 50, then it may be formed to reach the area between the side edge 32 of the first resin layer 30 and the first side 20. Alternatively, if the third resin layer is formed, either with the same material as of the second resin layer 50, or with a material that has either a larger modulus or a higher level of hardening and contraction than that of the second resin layer 50, then it may be formed to avoid the area between the side edge 32 of the first resin layer 30 and the first side 20.

In the present embodiment, the second resin layer 50 is installed to avoid the area where the electrodes 16 are not disposed in the semiconductor chip 10. Furthermore, in the second resin layer 50, its edge, where its internal stress tends to concentrate, avoids the area that the electrodes 16 are not disposed. Therefore, it is possible to suppress the effect on the semiconductor chip 10 (more specifically, the passivation film 18) caused by the internal stress concentration of the second resin layer 50.

Figure 4:
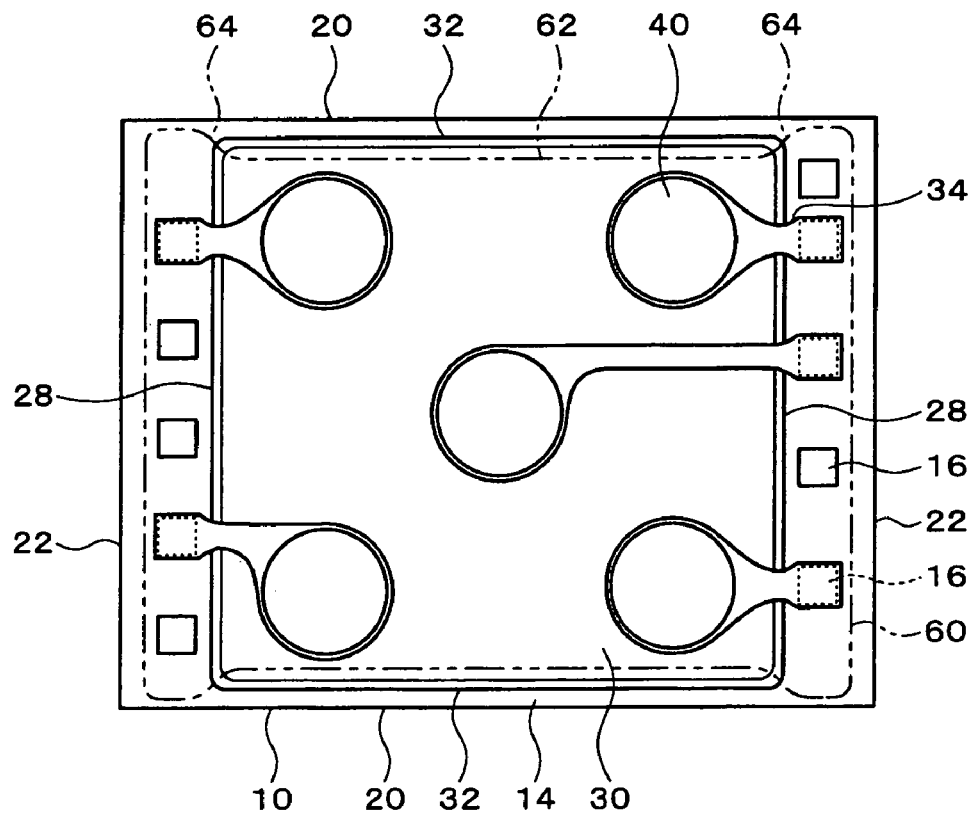
FIG. 4 is a drawing that describes the modified example of the semiconductor device in the embodiment of the present invention.

FIG. 4 is a drawing that describes the modified example of the semiconductor device in the embodiment of the present invention. In the modified example shown in FIG. 4, the second resin layer 60 has a different shape than the above-mentioned second resin layer 50, whereas other items fall under the above-mentioned item.

In FIG. 4, a side edge 62, located on the side of the first side 20 of the second resin layer 60, has a curved part 64 that is diversely distant from the first side 20. Details are as follows. On the side of the first side 20, the second resin layer 60 is formed so as not to spread out from the first resin layer 30. On the other hand, the part of the second resin layer 60 that spreads out from the first resin layer 30, stretches to the direction of the second side 22 so as to get closer to the first side 20. Correspondingly, the second resin layer 60 has a curved part 64.

Figure 5:
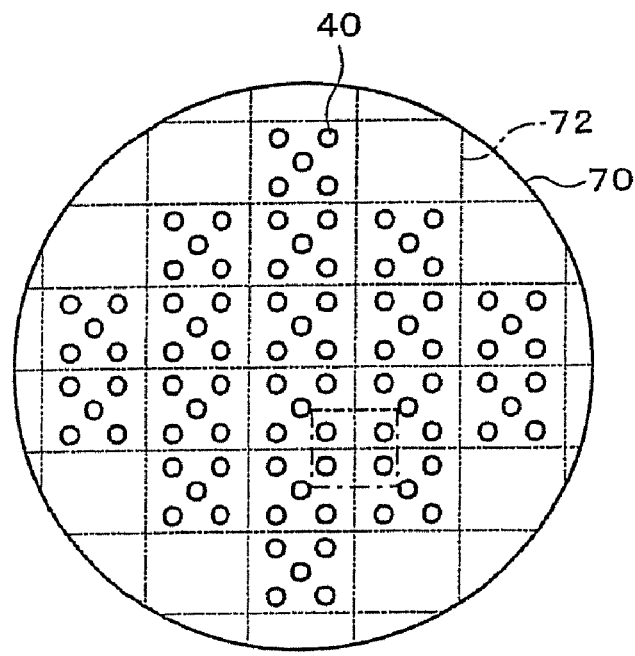
FIG. 5 is a drawing that describes the manufacturing method of the semiconductor device in the present invention.
Figure 6:
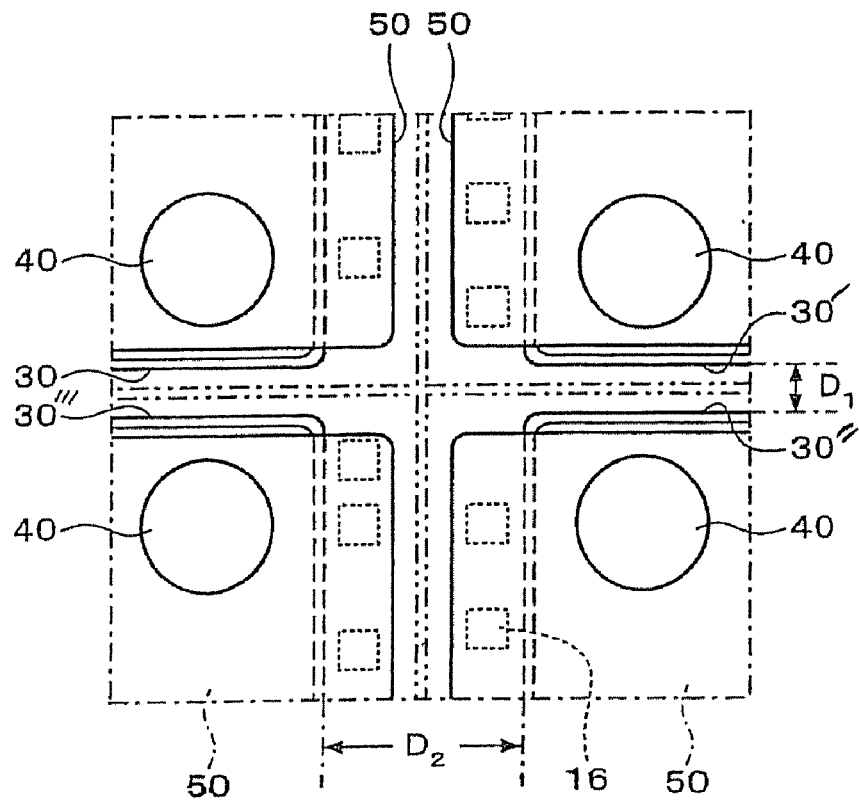
FIG. 6 is a magnified drawing of the part surrounded by single dotted line in the semiconductor wafer shown in FIG. 5.

FIG. 5 is a drawing that describes the manufacturing method of the semiconductor device in the present invention. FIG. 6 is a magnified drawing of the part surrounded by single dotted line in the semiconductor wafer shown in FIG. 5.

A semiconductor wafer 70 shown in FIG. 5 is cut off (for example, diced) along a line 72 (for example, a dicing line), and the part surrounded with the line 72 transforms into the above-mentioned semiconductor chip 10. In other words, in the semiconductor wafer 70, a plurality of the integrated circuit 12 (refer to FIG. 2 and FIG. 3) is formed. Each of the parts in the semiconductor wafer 70 that transform into the semiconductor chips 10, on which the above-mentioned structure is installed, thus the semiconductor wafer 70 having this structure can be defined as a semiconductor device (an aggregation of multiple semiconductor devices).

As shown in FIG. 6, the plurality of first resin layers 30 are arranged at a distance from each other, on the semiconductor wafer 70. The plurality of first resin layers 30 include a third resin layer 30', a fourth resin layer 30", and a fifth resin layer 30'''. A first distance D1, between an adjacent pair of the first resin layers 30 (i.e., between the third resin layer 30' and the fourth resin layer 30") in the first direction (in FIG. 6, a vertical direction), is smaller than a second distance D2, between an adjacent pair of the first resin layers 30 (i.e., between the fourth resin layer 30" and the fifth resin layer 30''') in the second direction (in FIG. 6, a horizontal direction) that is different from the first direction (for example, orthogonal). In the area of the second distance D2, the electrodes 16 is installed. A group of (multiple) electrodes 16 is installed to be arranged next to each of the first resin layers 30. The second resin layer 50 is formed to avoid the area of the first distance D1.

In case the modified example shown in FIG. 4 is applied, the second resin layer 60 is formed so as to exceed the first resin layer 30 in the second direction (in FIG. 6, a horizontal direction) and to have the curved part 64 so that the location of the side edge 62 varies in the first direction (in FIG. 6, a vertical direction).

In the manufacturing method of the semiconductor device in the present embodiment, a plurality of the first resin layers 30 is formed in the semiconductor wafer 70. Each first resin layer 30 is formed so that a group of the electrodes 16 is arranged next to it. The first resin layer 30 may be formed by forming a resin precursor over the semiconductor wafer 70 in the form of a layer with spin coating method and the like, and a patterning with lithography, etc. The plurality of the first resin layer 30 is formed, so that a first distance D1, between an adjacent pair of the first resin layers 30 in the first direction (in FIG. 6, a vertical direction), is smaller than a second distance D2, between an adjacent pair of the first resin layers 30 in the second direction (in FIG. 6, a horizontal direction) that is different from the first direction.

The wirings 34 are formed so that each of them respectively include the first part 36 and the second part 38 that are located on each of the first resin layers 30 (refer to FIG. 2). The forming method may include formation of a film with sputtering or evaporation, as well as its etching.

Then, the second resin layer 50 is formed over each of the first resin layer 30 so as to cover the second part 38 of the wiring 34. The second resin layer 50 may be formed by forming a resin precursor in the form of a layer with the spin coating method and the like, and a patterning with lithography, etc. When forming the layer with resin precursor, as shown in FIG. 6, the first distance D1, between an adjacent pair of the first resin layers 30 in the first direction (in FIG. 6, a vertical direction), is narrow, hence thicker resin precursor tends to be formed here.

Consequently, in the present embodiment, the second resin layer 50 is formed so as to avoid the first distance D1. For example, within the resin precursor formed in the form of a layer in order to form the second resin layer 50, the part that is in the first distance D1 area is removed.

Furthermore, the external terminal 40 is installed over the first part 36 of the wiring 34. Moreover, the semiconductor wafer 70 is cut into the areas of a plurality of the integrated circuits 12. By cutting the semiconductor wafer 70, a plurality of semiconductor devices are obtained. In this method, packaging is conducted per wafer. Other item and effects are omitted since they can be lead by the contents described for the above-mentioned semiconductor device.

In the present embodiment, the resin precursor is installed so as to avoid the area of the narrow distance D1 that is in between an adjacent pair of the first resin layers 30, while the resin precursor, installed in the form of a layer in order to form the second resin layer 50, tends to get thick in that area. Moreover, the second resin layer 50 is formed in a way that its edge, where its internal stress tends to concentrate, avoids the area of the first distance D1. Therefore, it is possible to suppress the effect on the semiconductor wafer 70 caused by the internal stress concentration of the second resin layer 50.

Figure 7:
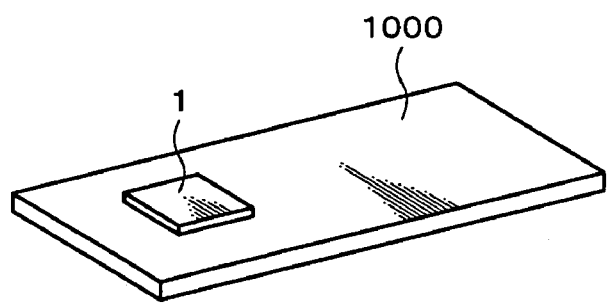
FIG. 7 is a drawing that shows the circuit board in the embodiment of the present invention.
Figure 8:
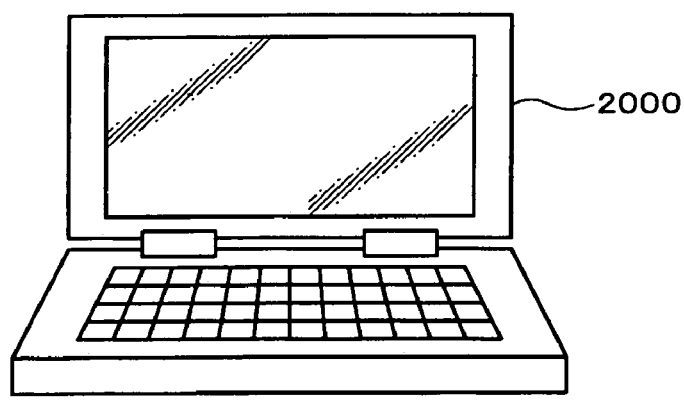
FIG. 8 is a drawing that shows the electronic appliance in the embodiment of the present invention.
Figure 9:
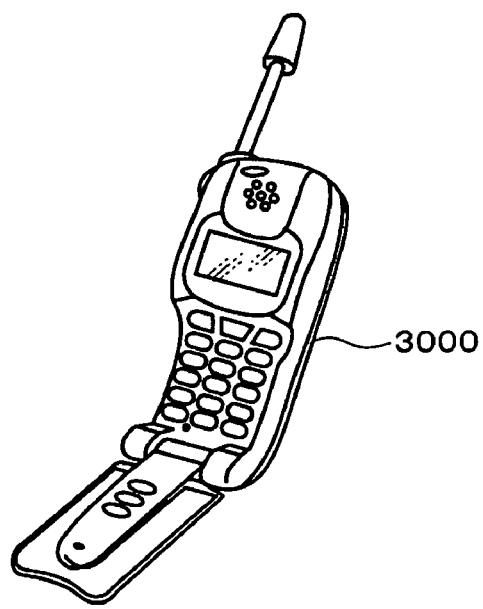
FIG. 9 is a drawing that shows the electronic appliance in the embodiment of the present invention.

In FIG. 7, a circuit board 1000, whereon the semiconductor device 1 in the embodiment of the present invention is mounted, is shown. As for electric appliances that have the semiconductor device in the embodiment of the present invention, a lap top type personal computer 2000 is shown in FIG. 8, and a mobile phone 3000 is shown in FIG. 9.

The present invention shall not be limited to the above-mentioned embodiments, and it is possible to conduct other kinds of modifications. For example, the present invention includes substantially identical structures (for example, structures of which a functionality, a method and a result are the same, or structures of which a purpose and result thereof are the same) to those described in the embodiment. Moreover, the present invention includes structures wherein the parts that are not substantial in the structure described in the embodiment are altered. Further, it includes a structure that performs the same work and effect described in the embodiment, or a structure that is able to accomplish the same purpose. Furthermore, it also includes a structure that has a known art in addition to the structure described in the embodiment. The present invention may also include the items wherein any one or more of the technical issues described in the embodiment are excluded, or the ones wherein the known art is excluded from the above-mentioned embodiment in a limited manner.

What is claimed is:

1. A semiconductor device comprising:
    a semiconductor wafer formed with a plurality of integrated circuits;
    a plurality of first resin layers arranged on the semiconductor wafer;
    a plurality of electrodes installed adjacent to each of the first resin layers, and electrically coupled to at least either one of the integrated circuits of the semiconductor wafer;
    a wiring that includes a first part and a second part located on each of the first resin layers;
    an external terminal installed on the first part of the wiring; and
    a second resin layer formed over each of the first resin layers so as to cover the second part of the wiring,
    wherein the plurality of first resin layers includes a third resin layer, a fourth resin layer adjacent to the third resin layer, and a fifth resin layer adjacent to the third resin layer;
    a first distance between the third resin layer and the fourth resin layer is smaller than a second distance between the third resin layer and the fifth resin layer; and
    the second resin layer is formed to avoid an area between the third resin layer and the fourth resin layer and is formed over a part of a region between the third resin layer and the fifth resin layer.

2. The semiconductor device according to claim 1, wherein the second resin layer has a curved part in plan view.

3. A semiconductor device comprising:
    a semiconductor chip that has a polygon surface and an integrated circuit, the integrated circuit being formed in the semiconductor chip, and the polygon surface being defined by a pair of first sides and a pair of second sides;
    a plurality of electrodes that are installed on the polygon surface, the plurality of electrodes being disposed along the second sides of the polygon surface, the plurality of electrodes electrically coupled to the integrated circuit;
    a first resin layer that is formed over the polygon surface of the semiconductor chip, the first resin layer including a pair of first side edges and a pair of second side edges, the pair of first side edges being located a distance away from the pair of first sides that is less than a distance that the pair of second side edges are located away from the pair of second sides;
    a wiring that includes a first part and a second part that are located on the first resin layer;
    an external terminal that is installed on the first part of the wiring; and
    a second resin layer that is formed over the first resin layer and the second part of the wiring, the second resin layer including a pair of edges that avoid areas between the pair of first sides and the pair of first side edges, and another pair of edges that are formed over regions between the pair of second sides edges and the second sides; and
    the plurality of electrodes are formed to avoid the areas between the pair of first side edges and the first sides of the polygon surface.

4. The semiconductor device according to claim 3, wherein a first side edge of the second resin layer has a curved part that is diversely distant from the first side of the polygon surface, the first side edge of the second resin layer being nearer the first side of the polygon surface than any other sides of the second resin layer.

5. A circuit board whereon the semiconductor device according to claim 3 is mounted.

6. An electronic appliance that has the semiconductor device according to claim 3.

7. A manufacturing method of a semiconductor device comprising the steps of:
    forming a plurality of first resin layers at a distance from each other, on a semiconductor wafer, whereon a plurality of integrated circuits is formed, and includes a plurality of groups of electrodes that are electrically coupled to at least either one of the integrated circuits;
    forming a wiring so as to include a first part and a second part located on each of the first resin layers;
    forming a second resin layer over each of the first resin layers so as to cover the second part of the wiring; and
    installing an external terminal on the first part of the wiring, wherein in each of the first resin layers, one group of the electrodes is arranged next to the first resin layer;
    the plurality of first resin layers includes a third resin layer, a fourth resin layer adjacent to the third resin layer, and a fifth resin layer adjacent to the third resin layer;
    in the plurality of the first resin layers, a first distance between the third resin layer and the fourth resin layer is smaller than a second distance between the third resin layer and the fifth resin layer; and
    the second resin layer is formed to avoid the area between the third resin layer and the fourth resin layer and is formed over a part of a region between the third resin layer and the fifth resin layer.

* * * * *